United States Patent
Ausserlechner

(10) Patent No.: US 10,309,802 B2
(45) Date of Patent: *Jun. 4, 2019

(54) ANGLE SENSORS, SYSTEMS, AND METHODS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/977,308

(22) Filed: May 11, 2018

(65) Prior Publication Data

US 2018/0259361 A1 Sep. 13, 2018

Related U.S. Application Data

(63) Continuation of application No. 13/944,391, filed on Jul. 17, 2013, now Pat. No. 9,982,989.

(51) Int. Cl.
  *G01D 5/14* (2006.01)
  *G01B 7/30* (2006.01)
  *G01R 33/07* (2006.01)

(52) U.S. Cl.
  CPC .............. *G01D 5/145* (2013.01); *G01B 7/30* (2013.01); *G01R 33/07* (2013.01)

(58) Field of Classification Search
  CPC ................................... G01R 33/07; G01B 7/30
  See application file for complete search history.

(56) References Cited

U.S. PATENT DOCUMENTS

| | | | |
|---|---|---|---|
| 6,479,987 B1 * | 11/2002 | Marx | G01B 7/30 324/207.12 |
| 8,836,326 B2 | 9/2014 | Maeda | |
| 2005/0264282 A1 | 12/2005 | Kawashima | |
| 2010/0001721 A1 | 1/2010 | Inotsuka | |
| 2010/0052664 A1 | 3/2010 | Nishizawa | |

(Continued)

OTHER PUBLICATIONS

Non-Final Office Action dated Mar. 12, 2015 in connection with U.S. Appl. No. 13/944,391.

(Continued)

*Primary Examiner* — Tung X Nguyen
*Assistant Examiner* — Lee E Rodak
(74) *Attorney, Agent, or Firm* — Eschweiler & Potashnik, LLC

(57) ABSTRACT

Embodiments relate to magnetic field angle sensors, including off-axis and on-axis sensors. In an embodiment, a magnetic field angle sensor comprises two sensor units, and each sensor unit comprises two sensor elements. The sensor units are spaced apart from one another and arranged proximate a magnet, wherein the two sensor elements of each sensor unit are responsive to the same magnetic field component induced by a magnet coupled to a shaft as the shaft rotates. In each sensor unit, a sum and a difference of the output signals of the two sensor elements can be calculated to determine a coarse estimation of a rotation angle, and a more refined estimation can be obtained by combining the coarse estimations of each sensor unit. In embodiment, the magnetic field angle sensor comprises a control unit or other circuitry to carry out this combining.

8 Claims, 11 Drawing Sheets

(56) References Cited

U.S. PATENT DOCUMENTS

| | | |
|---|---|---|
| 2010/0176804 A1 | 7/2010 | Ausserlechner |
| 2011/0043197 A1 | 2/2011 | Trontelj |
| 2012/0007589 A1 | 1/2012 | Okada |
| 2012/0161755 A1 | 6/2012 | Masson |
| 2013/0046488 A1 | 2/2013 | Donovan |
| 2013/0268234 A1 | 10/2013 | Janisch |
| 2014/0046625 A1* | 2/2014 | Baecher .................. G01B 7/30 |
| | | 702/151 |
| 2015/0008907 A1* | 1/2015 | Janisch .................. G01D 5/145 |
| | | 324/207.25 |

OTHER PUBLICATIONS

Non-Final Office Action dated Feb. 25, 2016 in connection with U.S. Appl. No. 13/944,391.
Non-Final Office Action dated Apr. 6, 2017 in connection with U.S. Appl. No. 13/944,391.
Final Office Action dated Aug. 28, 2015 in connection with U.S. Appl. No. 13/944,391.
Final Office Action dated Nov. 17, 2016 in connection with U.S. Appl. No. 13/944,391.
Final Office Action dated Oct. 18, 2017 in connection with U.S. Appl. No. 13/944,391.
Notice of Allowance dated Feb. 6, 2018 in connection with U.S. Appl. No. 13/944,391.

* cited by examiner

ANGLE SENSORS, SYSTEMS, AND METHODS

REFERENCE TO RELATED APPLICATION

This application is a continuation of U.S. application Ser. No. 13/944,391 filed Jul. 17, 2013, the contents of which are incorporated by reference in their entirety.

TECHNICAL FIELD

The invention relates generally to magnetic field sensors and more particularly to magnetic field angle sensors for sensing an angle of rotation of a shaft or other object.

BACKGROUND

Magnetic field sensors can be used to sense an angle of rotation of a shaft. For example, a magnet can be mounted on the shaft such that it rotates with the shaft, and a magnetic field sensor can be arranged proximate the magnet in order to sense a magnetic field induced by the magnet as it rotates with the shaft. When the magnetic field sensor is mounted next to or adjacent the shaft, i.e., off of the axis of rotation of the shaft, the sensor is often referred to as an "off-axis" magnetic field angle sensor. Off-axis magnetic field angle sensors often are implemented when the end of the shaft is unavailable as a location for the sensor or there simply is not space available on the shaft.

In many applications there is a general preference for magnetic field angle sensors, including off-axis magnetic field angle sensors, to be inexpensive and non-complex while also being robust with respect to external magnetic fields and other disturbances. A drawback of some conventional approaches, then, is a requirement of at least two sensor substrates with sensor elements having the same magnetic sensitivity. The required matched magnetic sensitivity is difficult to obtain and in combination with the need for multiple sensor substrates is more expensive to produce.

SUMMARY

Embodiments relate to magnetic field angle sensors, systems and methods. In an embodiment, a magnetic field angle sensor comprises a magnet rotatable about an axis of rotation; a least one sensor unit arranged proximate the magnet, the at least one sensor unit comprising two magnetic field sensor elements arranged on a first continuous surface of a substrate and spaced apart from one another along a direction of movement of the magnet, the two magnetic field sensor elements responsive to the same magnet field component; and circuitry coupled to the two magnetic field sensor elements to determine an absolute angle of rotation of the magnet from a sum and a difference of output signals of the two magnet field sensor elements.

In an embodiment, a magnetic field angle sensor comprises a magnet rotatable about an axis of rotation; a plurality of sensor units arranged proximate the magnet and spaced apart from one another about the axis of rotation by (360 degrees/n), where n is the number of sensor units and is greater than or equal to 2, wherein each of the at least two sensor units comprises at least two magnetic field sensor elements each responsive to the same magnetic field component induced by the magnet; and circuitry coupled to the plurality of sensor units to determine, for at least one sensor unit, a first coarse estimation of an angle of rotation of the magnet from a sum and a difference of output signals of the at least two magnetic field sensor elements, and to determine a second refined estimation of the angle of rotation of the magnet from at least one first coarse estimation.

BRIEF DESCRIPTION OF THE DRAWINGS

Embodiments may be more completely understood in consideration of the following detailed description of various embodiments of the invention in connection with the accompanying drawings, in which.

Figure 1A:
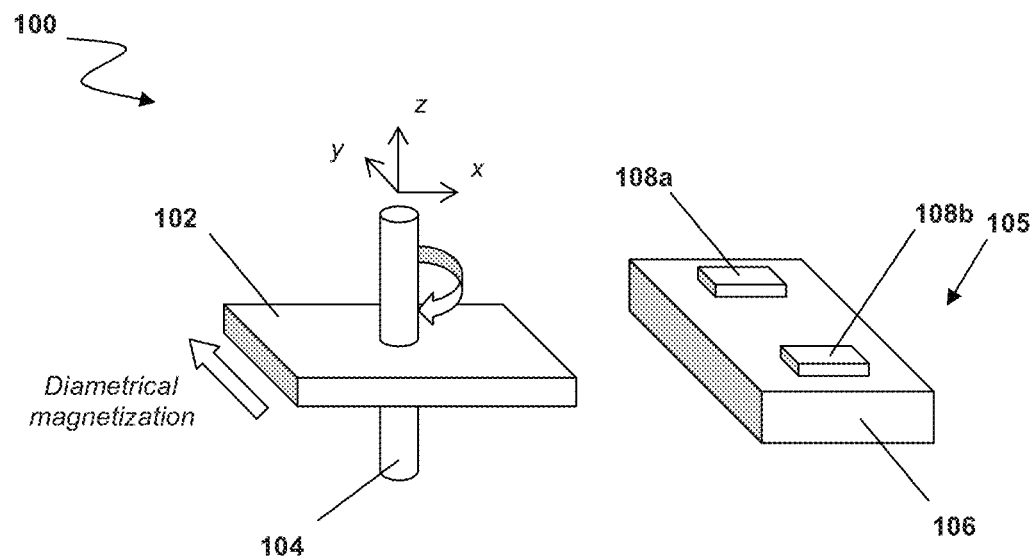
FIG. 1A is a perspective diagram of an off-axis angle sensor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to magnetic field angle sensors, including off-axis and on-axis sensors. In an embodiment, a magnetic field angle sensor comprises two sensor units, and each sensor unit comprises two sensor elements. The sensor units are arranged proximate a magnet and spaced apart from one another in a direction of movement of the magnet, wherein the two sensor elements of each sensor unit are responsive to the same magnetic field component induced by the magnet coupled to a shaft as the shaft rotates. In each sensor unit, a sum and a difference of the output signals of the two sensor elements can be calculated to determine a coarse estimation of a rotation angle, and a more refined estimation can be obtained by combining the coarse estimations of each sensor unit. In embodiment, the magnetic field angle sensor comprises a control unit or other circuitry to carry out this combining.

Figure 1B:
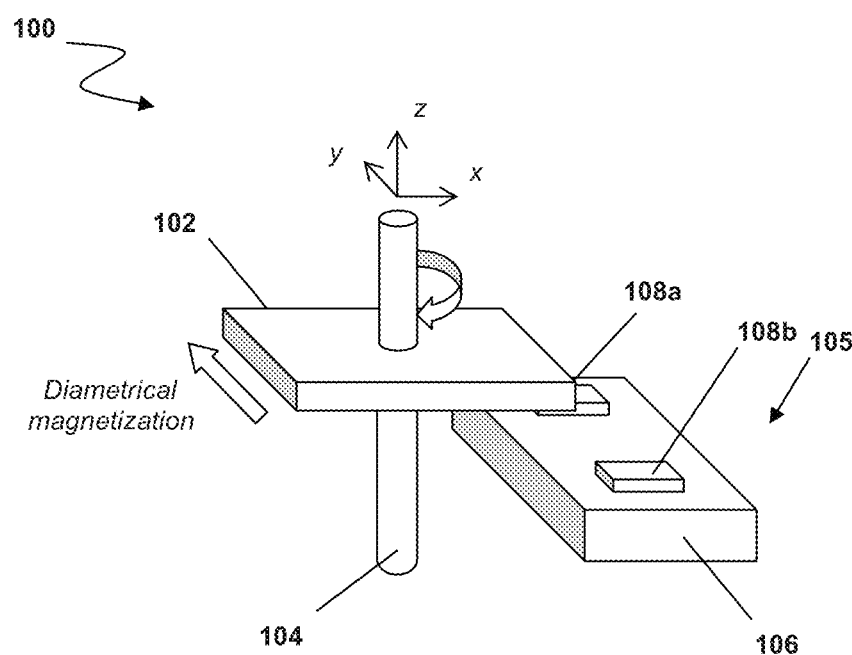
FIG. 1B is a perspective diagram of an off-axis angle sensor according to an embodiment.

Referring to FIGS. 1A and 1B, an off-axis magnetic field angle sensor 100 is depicted. Sensor 100 comprises a magnet 102 mounted or otherwise affixed to a shaft 104 such that magnet 102 rotates with shaft 104. Magnet 102 has a diametric magnetization in the direction indicated in FIGS. 1A and 1B, i.e., the y-direction. A sensor unit 105 comprises a substrate 106 and is arranged proximate magnet 102 and shaft 104. As depicted in both FIGS. 1A and 1B, a major plane of substrate 106, i.e., the surface on which magnetic field sensor elements 108 are mounted, is arranged perpendicularly to the rotation axis of shaft 104 as illustrated. In embodiments, substrate 106 can comprise a substrate, die, circuit board or other suitable structure, though for convenience the term substrate generally will be used herein but it not be considered limiting. In one embodiment, two magnetic field sensor elements 108a and 108b are arranged on substrate 106.

The relative position of substrate 106 and magnet 102 can vary in embodiments, as can the arrangement and orientation of sensor elements 108a and 108b. In FIG. 1A, substrate 106 is adjacent to shaft 104 and magnet 102 and can be coplanar with magnet 102. In FIG. 1B, substrate 106 is again adjacent shaft 104 and is arranged below magnet 102. FIGS. 1A and 1B are merely exemplary of some embodiments, and the relative positions of magnet 102, shaft 104, substrate 106 and/or sensor elements 108 can vary in still other embodiments. For example, in other embodiments a plurality of sensor units 105 having sensor elements 108a and 108b can be used, arranged on other sides of magnet 102 and shaft 104. Moreover, FIG. 1 is not to scale and a simplified conceptual depiction to illustrate basic components and features of an embodiment of sensor 100. Other embodiments, including on-axis embodiments, will be discussed elsewhere herein.

Figure 2A:
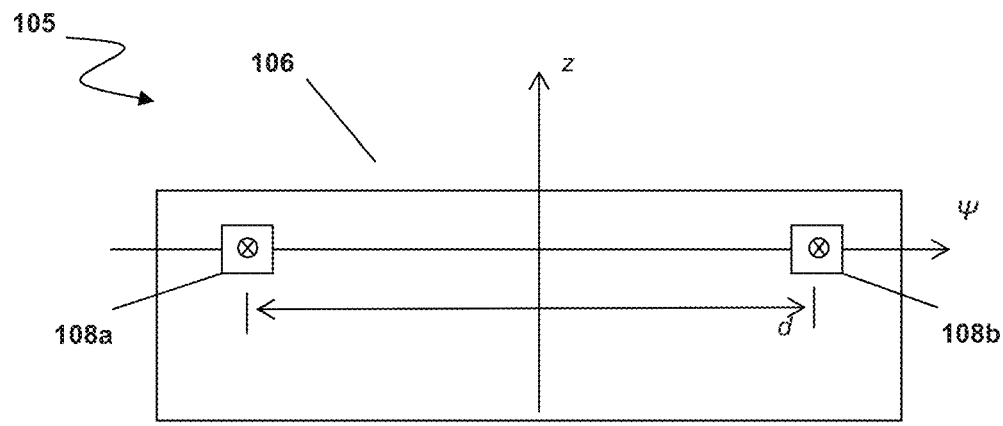
FIG. 2A is a top view block diagram of a sensor unit according to an embodiment.
Figure 2B:
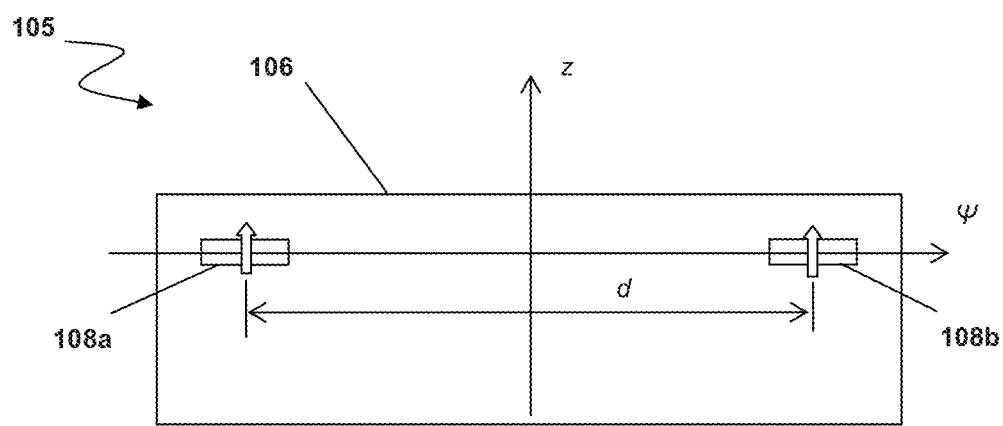
FIG. 2B is a top view block diagram of a sensor unit according to an embodiment.
Figure 2C:
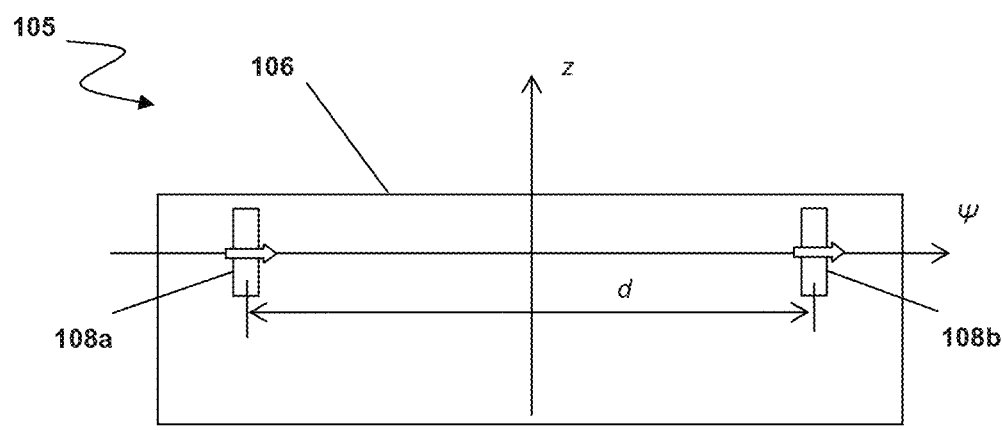
FIG. 2C is a top view block diagram of a sensor unit according to an embodiment.

FIG. 2A depicts one embodiment of a sensor unit 105. Sensor unit 105 comprises substrate 106 on which two magnetic field sensor elements 108a and 108b, which can comprise Hall plates, magnetoresistive elements, MAGFETs or other suitable out-of-plane magnetic field sensor elements, as sensor elements 108a and 108b are responsive to a magnetic field component which is perpendicular to the main plane of substrate 106 as depicted in FIG. 2. In other embodiments, in-plane sensor elements can be used, such as vertical Hall elements, magnetoresistive elements such as AMR, GMR, TMR or others, or still other suitable sensor elements. For example, FIGS. 2B and 2C depict sensor units 105 comprising vertical Hall sensor elements 108a and 108b, with the white arrows in each figure indicating the sensitivity direction of each sensor element 108a and 108b. Generally in FIGS. 2B and 2C, as well as in FIG. 2A, sensor elements 108a and 108b are spaced apart on substrate 106 in a direction of relative movement of magnet 102 when it rotates. In still other embodiments, sensor elements 108a and 108b can be configured to be operated as dynamic offset compensation circuits (e.g., in spinning current, spinning voltage or other suitable operational schemes).

Figure 3A:
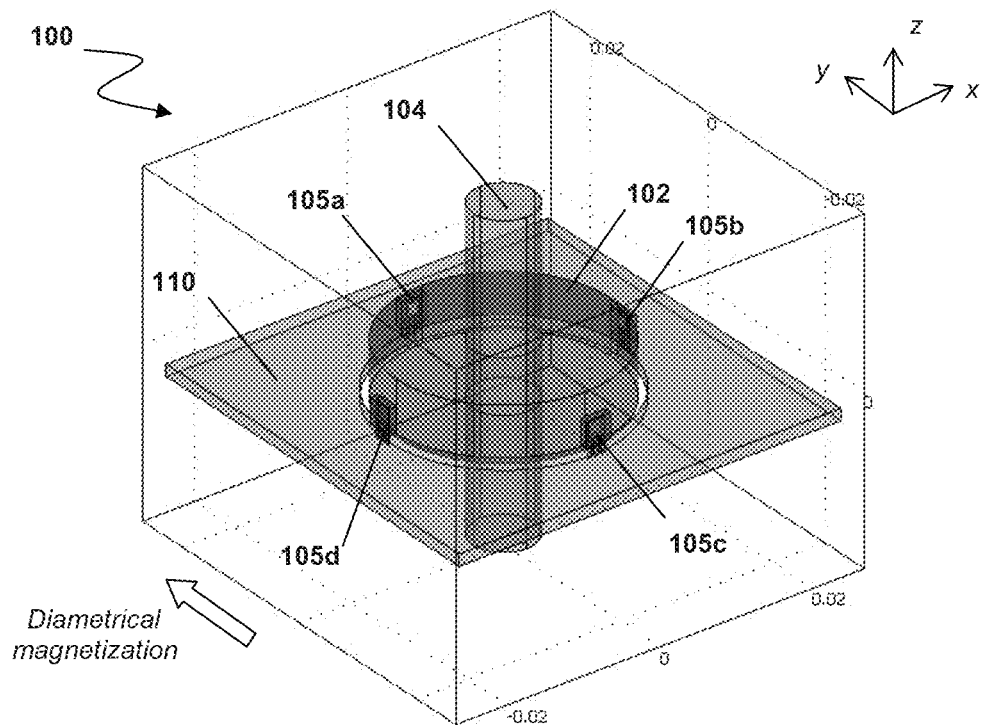
FIG. 3A is a perspective and partially transparent view of an angle sensor according to an embodiment.
Figure 3B:
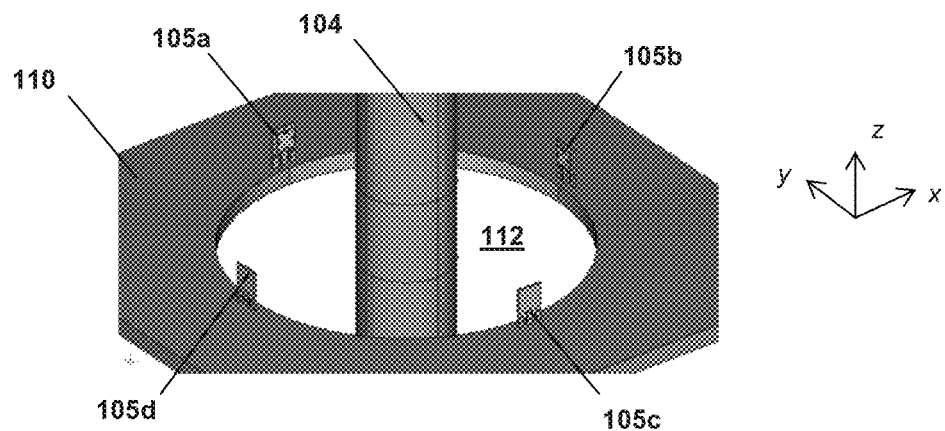
FIG. 3B is an enlarged view of a portion of FIG. 3A with a magnet omitted according to an embodiment.
Figure 3C:
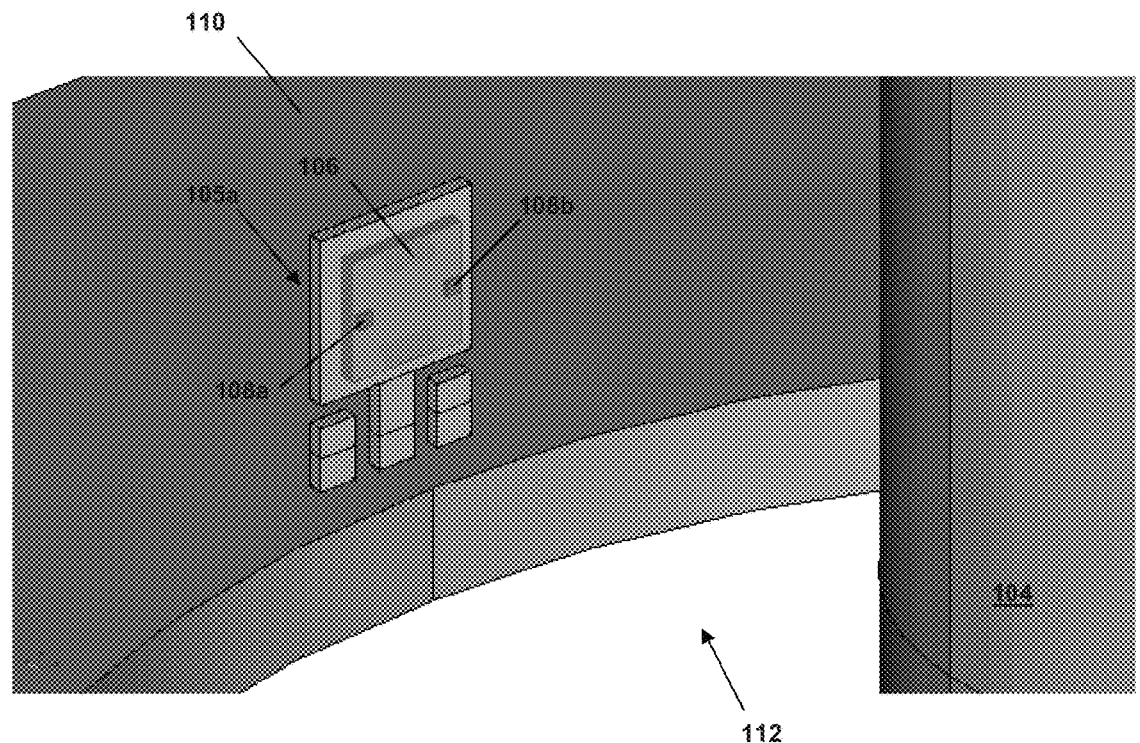
FIG. 3C is an enlarged view of a portion of FIG. 3B.

In FIG. 3, another relative configuration of sensor units 105, magnet 102 and shaft 104 is depicted, with FIG. 3A being an overall perspective view, FIG. 3B a detailed perspective view with magnet 102 not depicted, and FIG. 3C a detailed perspective view of a sensor unit 105a. In FIG. 3A, a plurality of sensor units 105a, 105b, 105c and 105d are used. The number of relative configuration of sensor units 105 can vary in other embodiments, such that more or fewer sensor units 105 can be used and their relative spacing and arrangement on a substrate 110 can vary. In general, sensor units 105 are evenly spaced at (360 degrees/n), where n is the number of sensor units 105 and is greater than or equal to 2. For example, in another embodiment two sensor units 105a and 105c are used, arranged opposite one another across magnet 102 and shaft 104 and spaced apart by (360/2) or 180 degrees. As depicted, sensor units 105a-d are mounted to substrate 110 which comprises an aperture 112 (see FIGS. 3B and 3C) in which shaft 104 and magnet 102 are arranged such that sensor units 105a-d are proximate magnet 102 as magnet 102 rotates with shaft 104. In embodiments, care can be taken with respect to the accuracy of positioning of sensor units 105a-d with respect to magnet 102 and/or aperture 112 during assembly.

The depiction in FIG. 3, as well as the rest of the drawings included here, is not necessarily to scale, nor are all components, features and details depicted. For example, traces on substrate 110, including those coupling sensor units 105a-105d, is not specifically depicted but nevertheless understood by those skilled in the art.

FIG. 3C is an enlarged view of one sensor unit 105a. Sensor unit 105a comprises substrate 106 on which two magnetic field sensor elements 108a and 108b are arranged. More or fewer sensor elements 108 can be used in other embodiments, and sensor elements 108 can comprise magnetic field sensor elements such as Hall-effect sensor elements, including horizontal Hall plates or vertical Hall elements, magnetoresistive sensor elements or other suitable sensor elements in various embodiments. As appreciated by those skilled in the art, the arrangement and positioning of sensor elements 108 (and/or sensor unit 105a and substrate 106) relative to magnet 102 and shaft 104 can vary according to the type of sensor element used in any particular embodiment. In examples discussed herein, an ordinary horizontal Hall plate embodiment generally will be used, though any examples and discussion are not limiting with respect to other embodiments. In FIG. 3C, sensor elements 108a and 108b are arranged in the mid-plane of magnet 102, i.e., at z=0 in an embodiment.

Sensor elements 108a and 108b can form a gradiometer in some embodiments for sensing a gradient of a magnetic field induced by magnet 102, which is diametrically magnetized. In the embodiment of FIG. 3C, a circular cylindrical coordinate system can be used, having a radial component $B_R$, azimuthal component $B_\psi$ (i.e., $B_\psi$ with reference to FIG. 2) and axial component $B_z$ of a magnetic field B. Magnetic field components of diametrically magnetized magnet 102, including $B_R$, $B_\psi$ and $B_z$, vary sinusoidally with respect to the azimuthal position. Therefore, the gradients of $B_R$, $B_\psi$ and $B_z$, which are $dB_R/d\psi$, $dB_\psi/d\psi$ and $dB_z/d\psi$, also vary sinusoidally and are in quadrature with the original curves. Thus, $\{B_R, dB_R/d\psi\}$ is a pair of signals in which one has a $\sin(\psi)$-dependence and the other a $\cos(\psi)$-dependence. The same is true for $\{B_\psi, dB_\psi/d\psi\}$ and $\{B_z, dB_z/d\psi\}$.

In embodiments, one or more of these pairs of signals can be used to obtain cosine and sine signals, from which a rotation angle can be derived. For example, ψ=arctan [sine-signal, k*cosine-signal] according to the CORDIC (COordinate Rotation Digital Computer) algorithm, with k being a scaling factor used to equalize the amplitudes of the sine and cosine signals. The following definition of the arctangent is used in embodiments:

$$\psi = \operatorname{artan}[\sin\psi, \cos\psi]$$

$$\arctan[\sin\psi, \cos\psi] = \arctan\left(\frac{\sin\psi}{\cos\psi}\right) \text{(for } -90 \text{ degrees} < \psi < 90 \text{ degrees)}$$

$$\arctan[\sin\psi, \cos\psi] = \arctan\left(\frac{\sin\psi}{\cos\psi}\right) + 180° \text{(for } 90 \text{ degrees} < \psi < 270 \text{ degrees)}$$

Referring again to FIG. 3C, sensor elements 108a, 108b of sensor unit 105a (as well as of sensor units 105b-d) are the same in embodiments, such that both are responsive to the same magnetic field component. Referring also to FIG. 2, sensor element 108a is spaced apart from sensor element 108b in the psi-direction, where d=R×Δψ, with R being the radial distance of sensor elements 108a and 108b from the axis of rotation of shaft 104. Sensor 100 therefore can determine a difference between output signals of sensor elements 108a and 108b and use that difference as an estimate or approximation of $dB_R/d\psi$. Sensor 100 and/or circuitry coupled thereto, such as a control unit comprising, e.g., a microprocessor, also can average the output signals of sensor elements 108a and 108b in order to estimate or approximate the magnetic field component $B_R$.

Figure 3D:
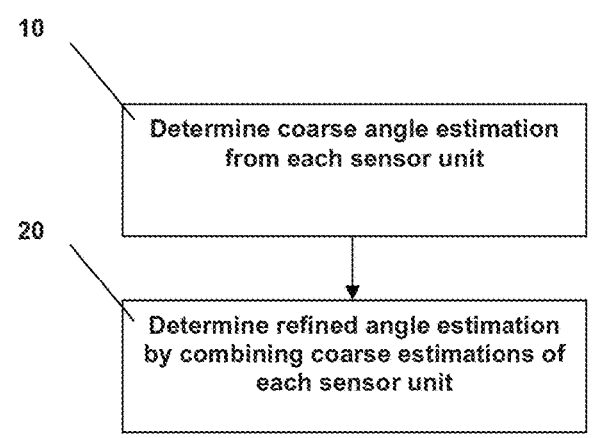
FIG. 3D is a flowchart according to an embodiment.

In other words, and referring to FIG. 3D, at 10 sensor 100 can obtain a coarse angle estimation or measurement from each sensor unit 105, i.e., sensor elements 108a and 108b of sensor unit 105a, such as by adding and subtracting the output signals of each sensor element 108a-108b as discussed in more detail below. Then, as also discussed in more detail herein below, sensor 100 can determine at 20 a refined or more precise angle estimation or measurement by combining, such as by averaging, the coarse angle estimations of each sensor unit 105a-105d.

Figure 5:
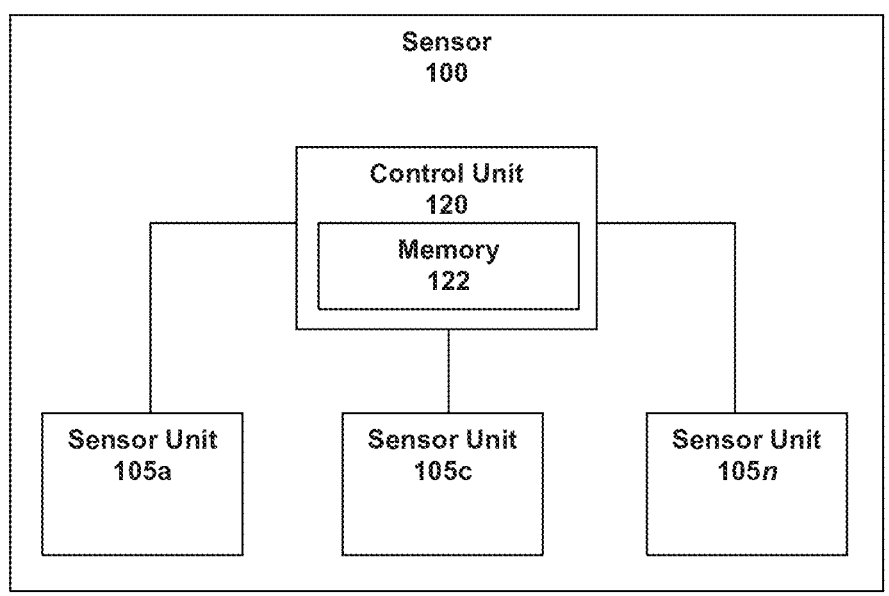
FIG. 5 is a block diagram of a sensor according to an embodiment.
Figure 6A:
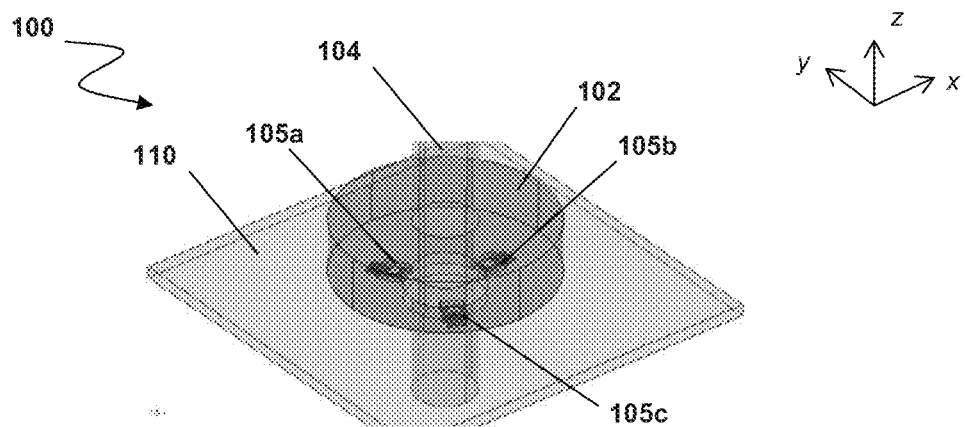
FIG. 6A is a perspective and partially transparent view of an angle sensor according to an embodiment.
Figure 6B:
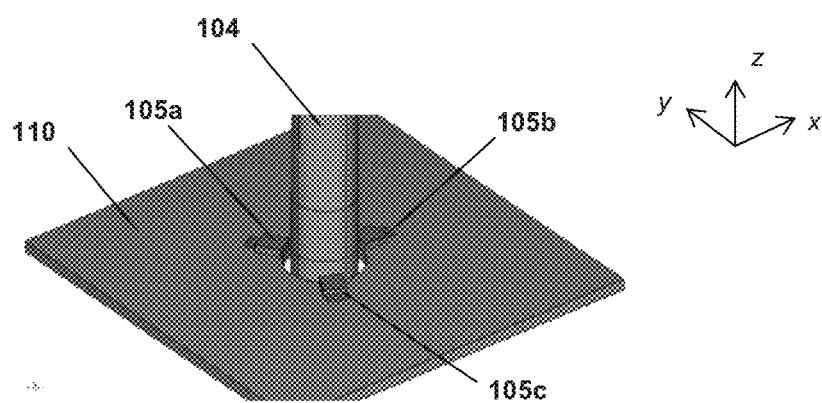
FIG. 6B is a view of a portion of FIG. 6A with a magnet omitted according to an embodiment.
Figure 6C:
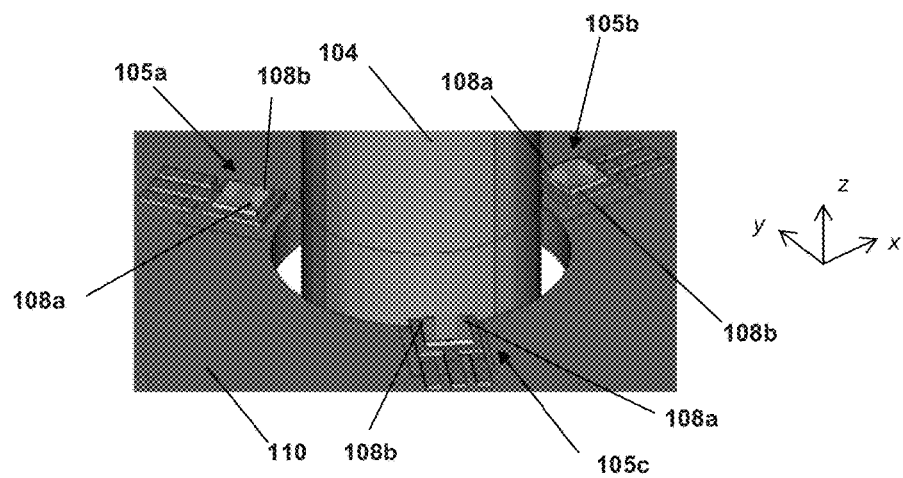
FIG. 6C is an enlarged view of a portion of FIG. 6B
Figure 6D:
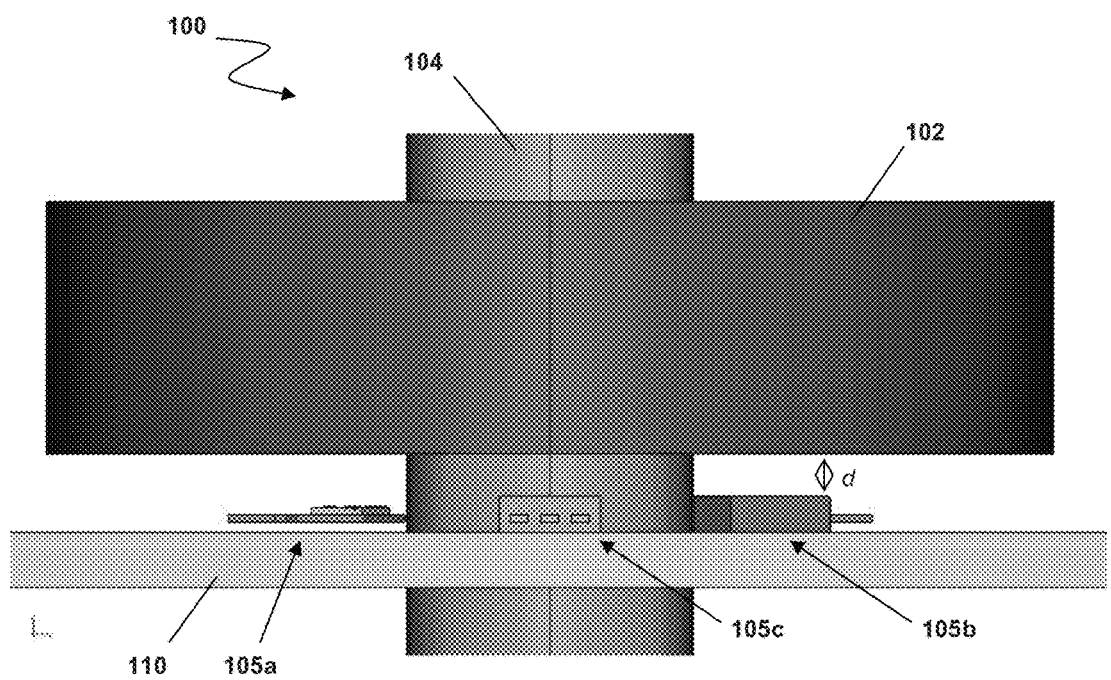
FIG. 6D is a side view of the sensor of FIG. 6A.

Herein throughout, the calculations and computations mentioned as being determined or carried out by sensor 100 can be carried out wholly within sensor 100 or a component thereof, by circuitry coupled thereto, or by some combination thereof, which may vary according to a particular embodiment, implementation or application. For example, a control unit, such as a microprocessor or other suitable circuitry, can be incorporated within sensor 100 or coupled thereto, as is discussed elsewhere herein with reference to the example embodiment of FIG. 5. Therefore, any particular example or mention of sensor 100 is not limiting.

Thus, sensor 100 can compute $$\psi' = \arctan\left[B_R(\psi_0), k\frac{dB_R(\psi_0)}{d\psi}\right]$$

in which the position of sensor unit 105, i.e., the intersection of the z-axis and the ψ-axis which is the midpoint between sensor elements 108a and 108b as depicted in FIG. 2, is assumed to be at the azimuthal angle $\psi_0$. Then it follows that $$\psi' = \arctan\left[\frac{OUT_1 + OUT_2}{2 \times S}, k\frac{OUT_1 - OUT_2}{S \times d_{12}/R}\right]$$

where $OUT_1$ and $OUT_2$ are the output signals of the sensor elements 108a or 108b (which are sensitive to the magnetic field component perpendicular to substrate 106, e.g, Hall plates in one embodiment), S is the magnetic sensitivity of each sensor element 108a and 108b defined by $OUT=S\times B_R$, indices 1 and 2 denote sensor element 108a (e.g., 1) or sensor element 108b (e.g., 2), $d_{12}$ is the spacing between sensor elements 108a and 108b, and R as above is the radial distance of sensor elements 108a and 108b from the axis of rotation of shaft 104. Because the same sensor output signals $OUT_1$ and $OUT_2$ are used in both calculations above, though one is added and the other subtracted, the absolute calibration of sensor elements 108a and 108b cancels out, assuming that both sensor elements 108a and 108b match. Thus, it holds that $$\psi' = \arctan\left[\frac{OUT_1 + OUT_2}{2}, k\frac{OUT_1 - OUT_2}{d_{12}/R}\right]$$

which is independent of the magnetic sensitivity of sensor elements 108a and 108b on substrate 106.

From the signals $B_R$ and $dB_R/d\psi$, an estimated rotation angle can be obtained. The above calculations, however, have not taken into consideration any effects of background or external magnetic field disturbances. In embodiments, such as the one depicted in FIGS. 3A-3C, a plurality of sensor units 105 can be used in sensor 100 in order to increase immunity of sensor 100 with respect to external magnetic field disturbances.

Figure 4:
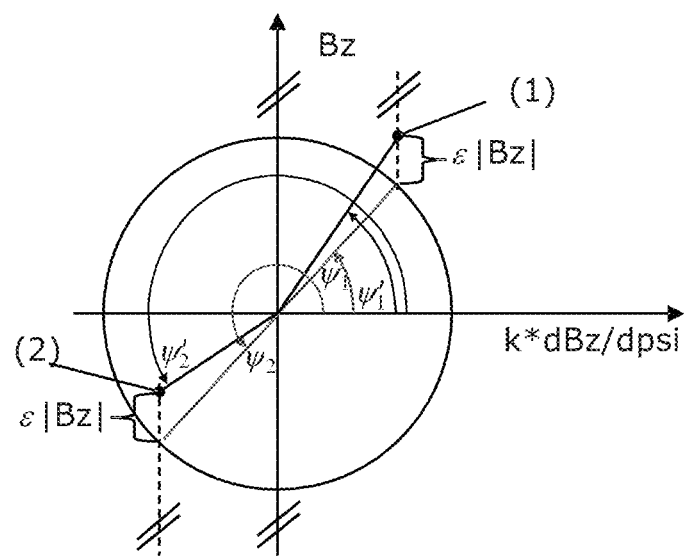
FIG. 4 is an angle diagram related to a axial magnetic field according to an embodiment.

Consider, for example, sensor units 105a and 105c in FIGS. 3B and 3C and a sensor layout such as that depicted in FIG. 2B, where one, e.g., sensor unit 105a is positioned at $\psi_0$ and the other, e.g., sensor unit 105b, is positioned at $\psi_0+180$ degrees. In other words, the sensor units 105a and 105b are opposite one another with respect to the axis of rotation of shaft 104, and their radial positions are identical. If a homogenous background magnetic field is applied, it has no effect on sensor units 105a and 105b if the direction of the field is orthogonal to $B_Z$. The magnetic field component parallel to a line on which both sensor units are located affects the $B_Z$ signal, but not the $dB_Z/d\psi$ signal, because the latter is a difference of fields on sensor elements 108a and 108b in any one sensor unit 105a or 105c such that a homogeneous background disturbance cancels out. A ratio of homogeneous applied magnetic field over $B_Z$ amplitude can be denoted as ε, and if ε=0.1 the disturbance magnetic field is 10% of the amplitude of $B_Z$ induced by magnet 102. Thus, the radial magnetic field on sensor unit 105a (at $\psi_0$) is $B_Z*(1+\varepsilon)$, while the radial magnetic field on sensor unit 105c (at $\psi_0+180$ degrees) is $B_Z*(1-\varepsilon)$. This is illustrated in FIG. 4. In $k*dB_Z/d\psi$, k is the aforementioned scaling factor intended to equalize the amplitudes of $B_Z$ and $dB_Z/d\psi$.

Thus, an error can be introduced into the angles sensed by sensor units 105a and 105c, where $\psi'_1$ is the angle measured by sensor unit 105a, and $\psi'_2$ is the angle measured by sensor unit 105b:

$\psi'_1$=arctan [sin ψ+ε, cos ψ]

$\psi'_2$=arctan [sin ψ−ε, cos ψ]

Assuming still that ε=0.1, both $\psi'_1$ and $\psi'_2$ can have a relatively significant angle error of arctan(0.1)=5.7 degrees near the worst-case positions of psi=0 degrees and 180 degrees, with the angle at sensor unit 105a being 5.7 degrees too large and at sensor unit 105c the opposite, 5.7 degrees too small. If sensor 100 calculates the average of both signals, the result is accurate, though in other rotational positions this will not necessarily be the case. For arbitrary rotational positions, the error is given by:

$$\Delta \psi = \frac{-1}{2} \arctan \frac{\varepsilon^2 \sin(2\psi)}{1 + \varepsilon^2 \cos(2\psi)}$$

where the error is largest at odd multiples of $\psi$=45 degrees. For $\varepsilon$=0.1, the maximum angle error is 0.29 degrees, which is 20 times smaller than the maximum angle error of sensor unit 105a alone.

Therefore, in a system such as sensor 100 in FIGS. 3A-3C, comprising four sensor units 105a-105d arranged at integer multiples of 90 degrees around shaft 104, then sensor unit 105a is at $\psi_0$, sensor unit 105b is at $\psi_0$+90 degrees, sensor unit 105c is at $\psi_0$+180 degrees and sensor unit 105d is at $\psi_0$+270 degrees, and the latter two are orthogonal to the assume background magnetic field and therefore not influenced by this disturbance. If sensor 100 computes the total angle again, but now as an average over all four angles of sensor units 105a-105d, the angle error of 0.29 degrees is reduced significantly to only 0.15 degrees. In other embodiments, more than four sensor units 105a-105d can be used, which can further reduce the angle error, though not at the same rate as illustrated here in increasing from two sensor units 105a and 105c to four sensor units 105a-105d. In addition to an even number of sensor units 105, in embodiments an odd number of sensor units 105 (e.g., 3, 5, 7, etc.) also can significantly suppress background magnetic interference in the estimated rotation angle.

Additionally or alternatively, in embodiments different combinations of $\psi_1$ and $\psi_2$ can be used to reduce the effects of external disturbance magnetic fields. For example, in the presence of some external disturbance and for k=1, sensor 100 can determine $$\psi'_1 = \arctan[\sin \psi + \varepsilon, \cos \psi]$$

by $$\tan \psi'_1 = \frac{\sin \psi + \varepsilon}{\cos \psi}$$

which is the inverse of the arctan [x, y] operation. The same can be applied to $\psi'_2$ by $$\tan \psi'_2 = \frac{\sin \psi - \varepsilon}{\cos \psi}$$

The average of both tangents is independent of the background field $\varepsilon$:

$$\frac{\tan \psi'_1 + \tan \psi'_2}{2} = \frac{1}{2}\left(\frac{\sin \psi + \varepsilon}{\cos \psi} + \frac{\sin \psi - \varepsilon}{\cos \psi}\right) = \tan \psi$$

Thus, in embodiments in which sensor 100 comprises at least two sensor units 105a and 105c arranged at $\psi_0$ and $\psi_0$+180 degrees, respectively (or, e.g., 105b and 105d arranged at $\psi_0$+90 degrees and $\psi_0$+270 degrees, respectively, or other opposing psi-positions 180 degrees apart), sensor 100 can compute the following as a better estimation of the rotation angle, in which homogenous background magnetic fields can cancel perfectly or nearly so in embodiments:

$$\arctan\left(\frac{\tan \psi'_1 + \tan \psi'_2}{2}\right)$$

Another factor that can influence the accuracy of sensor 100 in embodiments is imperfect (e.g., non-homogenous) magnetization of magnet 102. This non-homogeneity can result in magnetic field components induced thereby to have higher odd harmonics according to the following:

$$BR = \sin(psi) + b3*\sin(3*psi + kappa3) + b5*\sin(5*psi + kappa5) + \ldots$$

in which b3, b5, etc., are small but not negligible. If magnet 102 is mounted eccentrically with respect to the rotation axis of shaft 104, additional even-order harmonics can result. Thus, in embodiments a plurality of sensor units 105, such as discussed above, can be used in sensor 100 and evenly distributed. For example, in, e.g., FIGS. 3A-3C four sensor units 105a-105d are spaced apart by 90 degrees. In an embodiment comprising five sensor units 105, the spacing can be every 72 degrees or, generally, for N units at integer multiples of 360 degrees/N with output signals of psi1, psi2 . . . psiN, which are coarse estimates of the rotation angle of shaft 104.

A control unit of or coupled to sensor 100 can receive the psi values output by each sensor unit 105 and combine them to obtain a more accurate estimate of the rotation angle of shaft 104. In an embodiment, the psi values can be averaged, similar to as discussed above with respect to an embodiment comprising two sensor units 105a and 105c. In another embodiment, the N sensor units can be grouped into opposing pairs with respect to their orientation around shaft 104, similar to sensor units 105a and 105c, and 105b and 105d. Then, the arctangent for each pair can be determined according to the following:

$$\arctan\left(\frac{\tan \psi'_1 + \tan \psi'_2}{2}\right)$$

and the arctangents of all of the groups can be averaged. In yet another embodiment, the average of all of the tangents for each sensor unit 105 can be determined, with the arctangent of the average then calculated.

As previously mentioned, a scaling factor k can be used in embodiments to equalize the amplitudes of $B_R$ and $dB_R/d\psi$. This feature also can help to reduce the cost of sensor units 105. For example, k depends on the diameter of magnet 102 and the placement of sensor units 105, more particularly sensor elements 108, with respect to magnet 102. Thus, it is difficult to pre-program a single value for k given that these factors can vary, but the alternative can be more complicated and expensive (i.e., to determine k for each individual sensor 100 or even sensor unit 105 and to incorporate memory circuitry, such as EEPROM or other suitable memory, into each sensor unit 105).

Therefore, in embodiments k can be considered to comprise two factors, ka and kb, such that k=ka*kb. In one embodiment, and referring to FIG. 5, ka is an approximation of an appropriate ratio of amplitudes of $B_R$ and $dB_R/d\psi$, and kb is a corrective factor (e.g., about 1 in embodiments) stored not in sensor unit 105 but in memory circuitry 122 of a control unit 120 which is part of sensor 100. In another embodiment, control unit 120 and/or memory circuitry 122 can be external but coupled to sensor 100, and/or memory circuitry 122 can be external to control unit 120, and/or external or internal to any one or more sensor unit 105, with the depiction in FIG. 5 being exemplary of but one embodiment. Moreover, sensor 100 can comprise more or fewer components than are depicted in the simplified block diagram of FIG. 5. Control unit 120 then combines the output signals of all of sensor units 105a-105n to obtain a more precise estimation of the rotation angle of shaft 104. In practice, kb may be different for each sensor unit 105a-105n, or it may be the same for some or all.

Thus, in an embodiment sensor unit 105a provides an output signal which is:

$$\psi_1 = \arctan\left[B_R(\psi_0), k_a \frac{dB_R(\psi_0)}{d\psi}\right]$$

Sensor unit 105c, arranged opposite sensor unit 105a with respect to the axis of rotation of shaft 104 (as in, e.g., FIGS. 3A-3C), provides an output signal which is:

$$\psi_2 = \arctan\left[B_R(\psi_0 + 180°), k_a \frac{dB_R(\psi_0 + 180°)}{d\psi}\right]$$

Control unit 120 then determines the following:

$$\left[B_R(\psi_0), k_a \frac{dB_R(\psi_0)}{d\psi}\right] / \sqrt{(B_R(\psi_0))^2 + \left(k_a \frac{dB_R(\psi_0)}{d\psi}\right)^2}$$

and $$\left[B_R(\psi_0 + 180°), k_a \frac{dB_R(\psi_0 + 180°)}{d\psi}\right] /$$

$$\sqrt{(B_R(\psi_0 + 180°))^2 + \left(k_a \frac{dB_R(\psi_0 + 180°)}{d\psi}\right)^2}$$

whereby the square roots normalize the length of the signals to one. In another embodiment, each sensor unit 105 can directly provide the sine and cosine values to control unit 120, which can reduce computational complexity in sensor units 105 but impose higher data protocol demands between the sensor units 105 and control unit 120.

Next, control unit 120 adjusts the scaling factor k by determining $$\left[B_R(\psi_0), k_a k_b \frac{dB_R(\psi_0)}{d\psi}\right] / \sqrt{(B_R(\psi_0))^2 + \left(k_a \frac{dB_R(\psi_0)}{d\psi}\right)^2}$$

and $$\left[B_R(\psi_0 + 180°), k_a k_b \frac{dB_R(\psi_0 + 180°)}{d\psi}\right] /$$

$$\sqrt{(B_R(\psi_0 + 180°))^2 + \left(k_a \frac{dB_R(\psi_0 + 180°)}{d\psi}\right)^2}$$

In embodiments, the scaling factor portion kb can be determined from a calibration operation, such as during manufacturing and/or end-of-line testing of sensor 100, in which control unit 120 determines the amplitudes of the following, and therefrom calculates kb as a ratio between the two:

$$B_R(\psi_0) / \sqrt{(B_R(\psi_0))^2 + \left(k_a \frac{dB_R(\psi_0)}{d\psi}\right)^2}$$

$$k_a \frac{dB_R(\psi_0)}{d\psi} / \sqrt{(B_R(\psi_0))^2 + \left(k_a \frac{dB_R(\psi_0)}{d\psi}\right)^2}$$

Then, in one embodiment, control unit 120 determines new angles for sensor units 105a and 105c using the adjusted scaling factor $k = k_a * k_b$, according to $$\psi_1' = \arctan\left[B_R(\psi_0) / \sqrt{(B_R(\psi_0))^2 + \left(k_a \frac{dB_R(\psi_0)}{d\psi}\right)^2}, k_a k_b \frac{dB_R(\psi_0)}{d\psi} / \right.$$

$$\left. \sqrt{(B_R(\psi_0))^2 + \left(k_a \frac{dB_R(\psi_0)}{d\psi}\right)^2}\right]$$

and $$\psi_2' =$$

$$\arctan\left[\begin{array}{l} B_R(\psi_0 + 180°) / \sqrt{(B_R(\psi_0 + 180°))^2 + \left(k_a \frac{dB_R(\psi_0 + 180°)}{d\psi}\right)^2}, \\ k_a k_b \frac{dB_R(\psi_0 + 180°)}{d\psi} / \sqrt{(B_R(\psi_0 + 180°))^2 + \left(k_a \frac{dB_R(\psi_0 + 180°)}{d\psi}\right)^2} \end{array}\right]$$

and from there determines an improved angle estimate by $$\psi' = \frac{\psi_1' + (\psi_2' - 180°)}{2}$$

This can reduce the effects of homogeneous background fields, though it may not entirely cancel them. For example, if a background field is 10% of the amplitude of the BR field, the resulting angle error in ψ' will be less than 0.3 degrees, which may be acceptable in some or most situations.

Nevertheless, in another embodiment a second approach can more completely cancel out homogeneous background fields, in which control unit 120 calculates the sum of in-phase signals $\tilde{B}_R$ and the sum of quadrature signals $\tilde{Q}_R$ by:

$$\tilde{B}_R = B_R(\psi_0) / \sqrt{(B_R(\psi_0))^2 + \left(k_a \frac{dB_R(\psi_0)}{d\psi}\right)^2} +$$

$$B_R(\psi_0 + 180°) / \sqrt{(B_R(\psi_0 + 180°))^2 + \left(k_a \frac{dB_R(\psi_0 + 180°)}{d\psi}\right)^2}$$

$$\tilde{Q}_R = k_a k_b \frac{dB_R(\psi_0)}{d\psi} / \sqrt{(B_R(\psi_0))^2 + \left(k_a \frac{dB_R(\psi_0)}{d\psi}\right)^2} +$$

$$k_a k_b \frac{dB_R(\psi_0 + 180°)}{d\psi} / \sqrt{(B_R(\psi_0 + 180°))^2 + \left(k_a \frac{dB_R(\psi_0 + 180°)}{d\psi}\right)^2}$$

Only the in-phase signals are affected by homogeneous background magnetic fields, as the quadrature signals are gradiometric signals in which homogeneous background magnetic fields cancel out. Thus, control unit 120 can also use one of the following instead:

$$\tilde{Q}_R = 2k_a k_b \frac{dB_R(\psi_0)}{d\psi} / \sqrt{(B_R(\psi_0))^2 + \left(k_a \frac{dB_R(\psi_0)}{d\psi}\right)^2}$$

or $$\tilde{Q}_R = 2k_a k_b \frac{dB_R(\psi_0 + 180°)}{d\psi} /$$
$$\sqrt{(B_R(\psi_0 + 180°))^2 + \left(k_a \frac{dB_R(\psi_0 + 180°)}{d\psi}\right)^2}$$

The homogeneous background magnetic field also cancel out in the sum $B_R$ of in-phase signals, such that both $\tilde{B}_R$ and $\tilde{Q}_R$ are free of background interference. Thus, control unit 120 can calculate the angle according to $$\psi' = \arctan[\tilde{B}_R, \tilde{Q}_R]$$

Referring to FIG. 6, an alternative to the embodiment of FIGS. 3A-3C comprises surface-mounted devices (SMDs), with the sensor units 105a-105c arranged below (as depicted) or above magnet 102. The views of FIGS. 6A, 6B and 6C are similar to the views of FIGS. 3A, 3B and 3C, respectively. The configuration of FIG. 6 can be advantageous in some applications, for example when magnet 102 has a larger diameter, such as greater than about 15 mm, or when SMDs are desired or available for some other reason. Additionally, the particular SMD depicted in FIG. 6 can vary in other embodiments, as can the package or other configuration in other, non-SMD embodiments. For example, SMDs with pins on both rather than a single side can be used in embodiments. In still other embodiments, Very Thin Quad Flat Non-Leaded (VQFN) packages can be used, or other suitable packages and/or configurations known or developed and as appreciated by those skilled in the art.

In the embodiment of FIG. 6, three sensor units 105a-105c are depicted, spaced apart from one another at integer multiples of 120 degrees around shaft 104, which can be nonmagnetic or ferrous in embodiments. The number of sensor units 105 and their relative arrangements can vary in other embodiments. For example, and similar to FIG. 3, four sensor units 105a-105d can be used in the configuration of FIG. 6 in another embodiment.

In embodiments, a distance d between the package of sensor units 105a-105c and magnet 102 is in a range of about 0.5 mm to about 3 mm, such as about 1 mm in an embodiment. As in other embodiments, magnet 102 is magnetized diametrically, and sensor elements 108a and 108b of each sensor unit 105a-105c are configured to detect the $B_z$, or axial, component of the magnetic field induced by magnet 102. Operation of sensor 100 can be similar to as is discussed herein with respect to other embodiments.

Figure 7A:
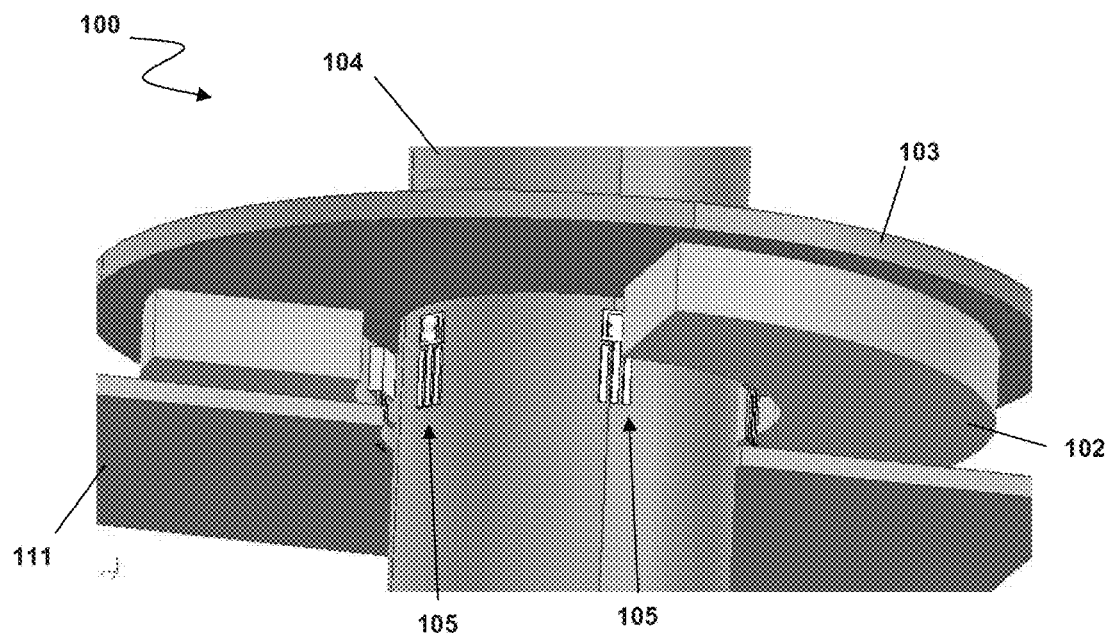
FIG. 7A is a partial perspective view of an angle sensor according to an embodiment.
Figure 7B:
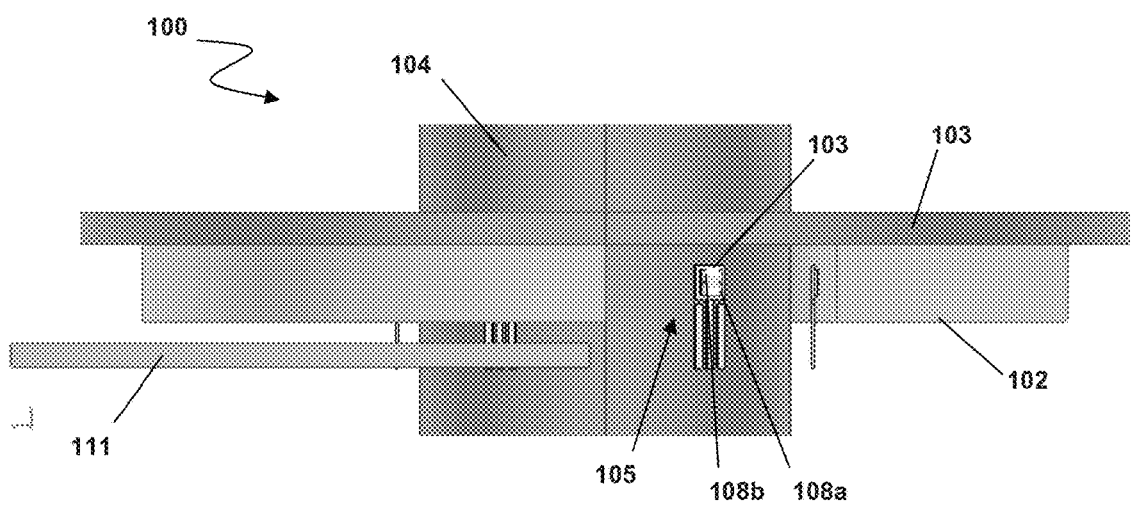
FIG. 7B is a side view of the angle sensor of FIG. 7A.

In yet another embodiment depicted in FIGS. 7A and 7B, sensor units 105 are arranged within the bore of magnet 102, which can comprise an annular cylinder having a first, inner radius (i.e., of the bore) and a second, outer radius. The leads of sensor units 105 are coupled to a printed circuit board (PCB) 111 such that the sensor units 105 extend into the bore of magnet 102, which is spaced apart from PCB 111. Magnet 102 is coupled to a disk portion 103 of shaft 104 such that magnet 102 rotates with shaft 104 in operation. Magnet can be coupled to shaft 104 in some other way in other embodiments, and/or the particular configuration of disk portion 103 can vary, e.g., a diameter of disk portion 103 with respect to a diameter of magnet 102, with the depiction in FIGS. 7A and 7B being merely one example. For example, a profile, shape, dimension or other configuration of the inner bore portion of magnet 102, proximate sensor units 105, can vary in embodiments. In one embodiment, the inner bore profile of magnet 102 has a conical-type shape opposite shaft 104. In another embodiment, the inner bore profile of magnet 102 is extended or angled in an axial direction toward sensor units 105, such as by less than about 3 mm, for example extending about 1 mm in such a direction in one embodiment.

In still other embodiments, with respect to FIG. 7 and others discussed herein, the material of disk 103 and/or shaft 104 can vary. For example, one or both can comprise a ferrous or otherwise magnetic material, such as iron, in embodiments. In other embodiments, however, one or both of disk 103 and shaft 104 can comprise a non-magnetic material. Though this can change the strength of the magnetic field and effects of external fields, it can have little effect on angle accuracy and can, in fact, reduce production costs if less expensive materials are used.

PCB 111 can comprise a unitary piece, or can comprise a plurality of pieces, e.g., two halves, which can be easier to manufacture, though care should be taken in assembly of sensor 100 with respect to position tolerances, such as for sensor units 105 relative to magnet 102. In FIG. 7A, only half of PCB 111 is shown, and a portion of magnet 102 is cut-away such that sensor units 105 within the bore can be seen. Though not depicted, a second disk can be included below PCB 111 in embodiments, which can improve shielding of external magnetic fields. In one embodiment, PCB 111 can comprise a unitary structure having an aperture comprising a first portion, such as near the center of PCB 11, in which shaft 104 is arranged and a second portion which extends from an edge or perimeter of PCB 111 to the first portion, enabling shaft 104 to be arranged in the first portion of the aperture without having to pass PCB 111 over an end of shaft 104, which can simply manufacturing and assembly. A width or other dimension of the second portion can be slightly larger than a diameter of shaft 104, e.g., at least about 1 mm larger in embodiments. The size and placement of the second portion of the aperture also should be considered with respect to the arrangement of sensor units 105 on PCB 111.

As depicted, substrates 106 of sensor units 105 are arranged such that the surface of substrate 106 on which sensor elements 108 are mounted is parallel with the [ψ, z]-plane. Sensor elements 108a and 108b, as in other embodiments, can comprise Hall plates or other suitable magnetic field sensor elements, for example ordinary Hall plates as depicted. The active surface of each of substrates 106 of sensor units 105 is arranged opposite (e.g., facing) magnet 102, rather than shaft 104, in one embodiment as depicted. In embodiments, sensor units 105 are arranged such that a center line of sensor elements 108a and 108b is generally in line with a midplane of magnet 102.

Figure 8:
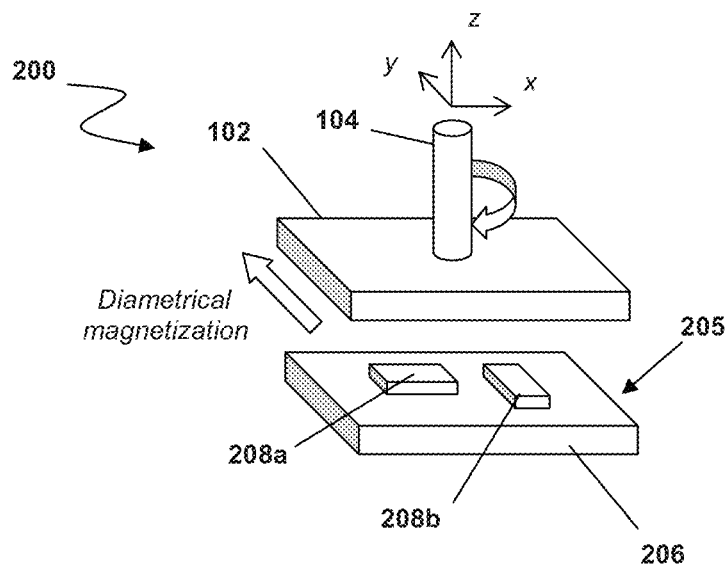
FIG. 8 is a perspective block diagram of an on-axis angle sensor according to an embodiment.

The embodiments discussed thus far have generally related to off-axis angle sensors, though it has been discovered that these principles also can apply to embodiments of on-axis angle sensors as well. An example on-angle sensor 200 is depicted in FIG. 8, with the same or similar reference numerals used to refer to the same or similar components, parts and/or features. In sensor 200, sensor unit 205 is arranged coaxially with shaft 104, with substrate 206 oriented perpendicularly thereto.

Figure 9:
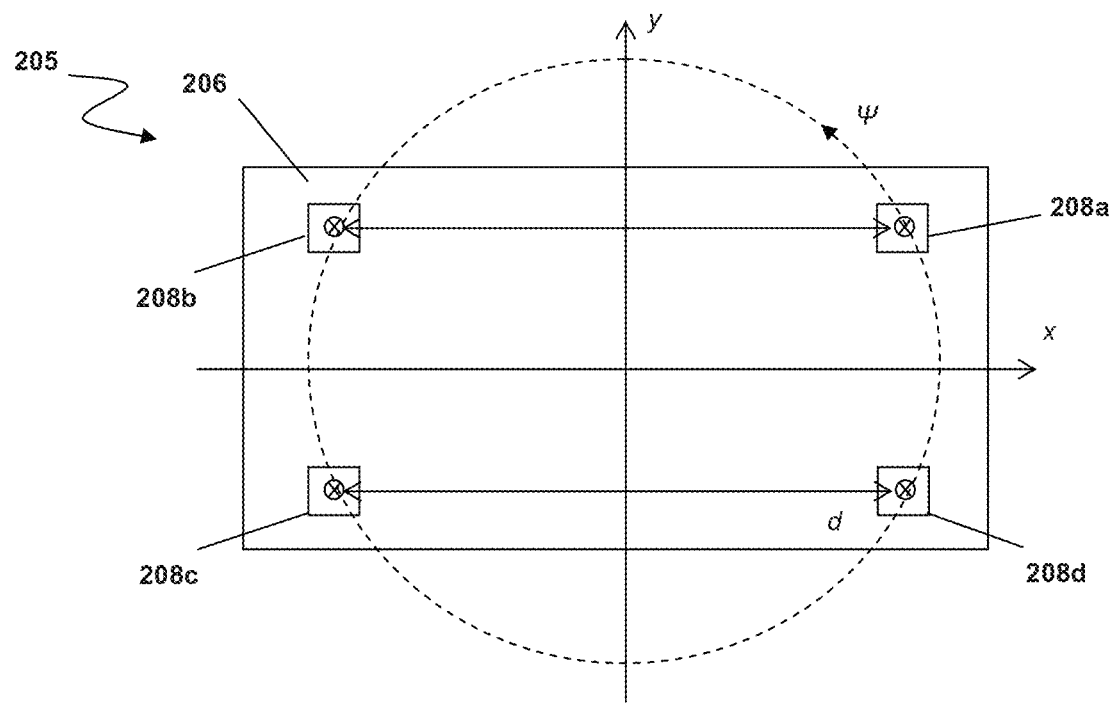
FIG. 9 is a top view block diagram of a sensor unit according to an embodiment.

Analogous to FIG. 2, FIG. 9 depicts an example layout of sensor unit 205 comprising at least two sensor elements, here four: sensor elements 208a, 208b, 208c and 208d. The four sensor elements 208-208d can be considered to comprise two sensor units (i.e., similar to sensor units 105a and 105b discussed above), with sensor elements 208a and 208b comprising a first sensor unit, and sensor elements 208c and 208d comprising a second sensor unit. In one embodiment, sensor elements 208-208d can be selected such that they are sensitive to the z-component of the magnetic field inducted by magnet 102, or sensor elements 208a-208d can be selected in other embodiments to be sensitive to the R-component or to the ψ-component. As in off-axis angle sensor embodiments, sensor elements 208a-208d can comprise Hall plates, vertical Hall elements, magnetoresistive elements, or other suitable magnetic field sensor elements.

Sensor elements 208a-208d can be considered to be arranged on a circle with the rotation angle ψ as shown, such that sensor element 208a is shifted in the ψ-direction with respect to each of sensor elements 208b-d, sensor element 208b is shifted in the ψ-direction with respect to sensor elements 208a, 208c and 208d, etc. Sensor elements 208a-208d are arranged around the rotation axis of shaft 102, which is aligned with the intersection of the x-axis and the y-axis in FIG. 9, which is also the center point of all of sensor elements 208a-208d. The mid-points between sensor elements of each sensor unit, i.e., the mid-point between sensor elements 208a and 208b and the midpoint between sensor elements 208c and 208d, are aligned with one another but at opposing positive and negative y-axis positions. In other words, the azimuthal position of the midpoint of sensor elements 208a and 208b and the azimuthal position of the midpoint of sensor elements 208c and 208d differ by 180 degrees. Though the radial positions may vary in some embodiments or implementations, in other embodiments the sensor elements are arranged to be mirror-symmetric with respect to the rotation axis of shaft 102 as follows: sensor elements 208a and 208c are mirror-symmetric with one another, and sensor elements 208b and 208d are mirror-symmetric with one another.

In operation, sensor 200 is similar to sensor 100 discussed herein above. Sensor 100, such as a control unit similar to control unit 120 or other circuitry of or coupled to sensor 100, determines a difference between and a sum of the output signals of each sensor unit, here for sensor elements 208a and 208b (e.g., Ba+Bb, and Ba−Bb, where Ba is the output signal of sensor element 208a and Bb is the output signal of sensor element 208b, etc.), and again for sensor elements 208c and 208d (e.g., Bc+Bd, and Bc−Bd). Then, an angle ψab and an angle ψcd are determined for each sensor unit according to $$\arctan[(Ba+Bb),k^*(Ba-Bb)]$$

This is repeated for sensor elements 208c and 208d:

$$\arctan[(Bc+Bd),k^*(Bc-Bd)]$$

Both angles then can be combined as discussed above according to:

$$\psi'=(\psi ab+\psi cd-180 \text{ degrees})/2$$

or $$\psi'=\arctan((\tan(\psi ab)+\tan(\psi cd)/2)$$

In another embodiment, sensor 100 can simply determine the following:

$$\psi'=\arctan[(Ba+Bb)-(Bc+Bd),k^*((Ba-Bb)-(Bc-Bd))]$$

Figure 10A:
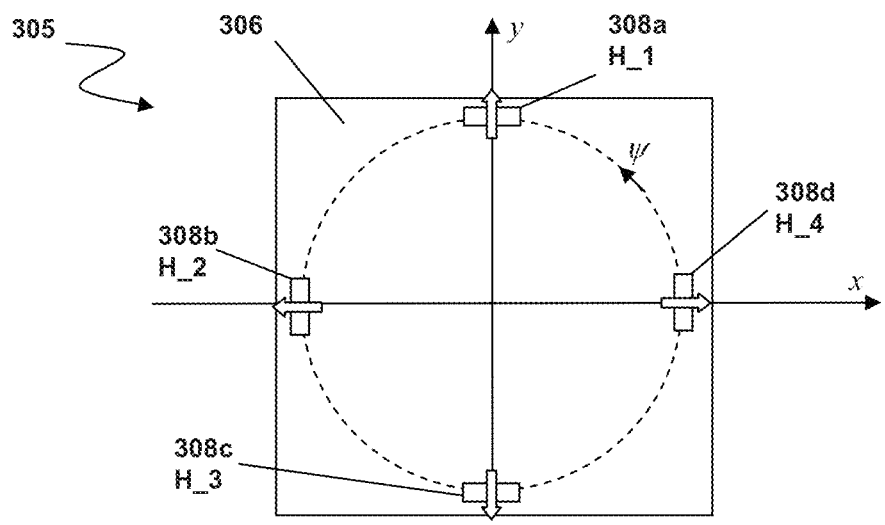
FIG. 10A is a top view block diagram of a vertical Hall sensor unit according to an embodiment.

In other on-axis embodiments, vertical Hall sensor elements can be used. In general, vertical Hall sensor elements are responsive to magnetic field components parallel to the plane of the sensor element, as opposed to perpendicular for ordinary Hall plate devices discussed elsewhere herein. Referring to FIG. 10A, one example configuration of a sensor element 305 utilizing vertical Hall devices is depicted. Here as in other embodiment, the same or similar reference numerals are used to refer to the same or similar elements or features. Sensor element 305 comprises a substrate 306 on which are arranged four vertical Hall sensor elements 308a (also referred to herein as H_1), 308b (H_2), 308c (H_3) and 308d (H_4). In the embodiment of FIG. 10A, sensor elements 308a-308d comprise BR sensor elements, given their orientations as depicted.

Similar to FIG. 9, sensor elements 308a-308d of FIG. 10A can be considered to be arranged on a circle with the rotation angle ψ as shown, such that sensor element 308a is shifted in the ψ-direction with respect to each of sensor elements 308b-d, sensor element 308b is shifted in the ψ-direction with respect to sensor elements 308a, 308c and 308d, etc. Sensor elements 308a-308d are arranged around the rotation axis of shaft 102, which is aligned with the intersection of the x-axis and the y-axis in FIG. 10A, which is also the center point of all of sensor elements 308a-308d. Though the radial positions may vary in some embodiments or implementations, in other embodiments the sensor elements are arranged to be mirror-symmetric with respect to the rotation axis of shaft 102.

Figure 10B:
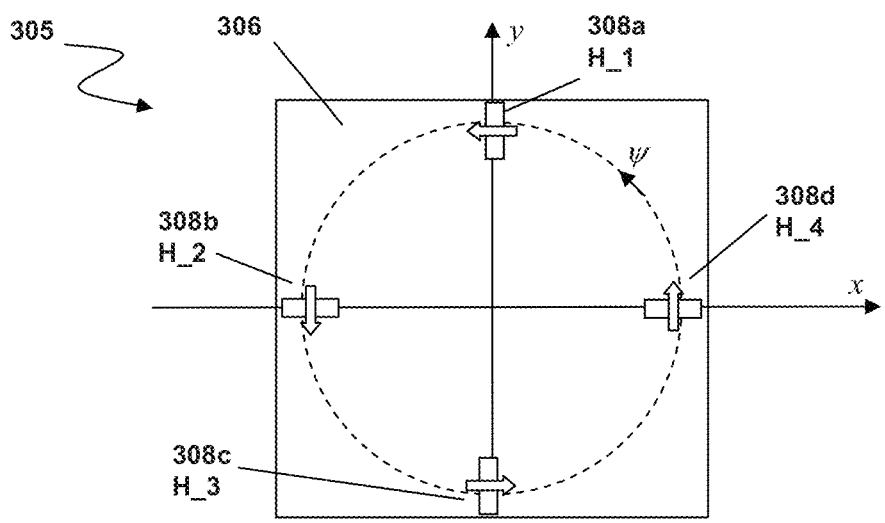
FIG. 10B is a top view block diagram of another vertical Hall sensor unit according to an embodiment.

Another embodiment of sensor unit 305 comprising vertical Hall sensor devices is depicted in FIG. 10B, in which the orientations of sensor elements 308a-308d are rotated counter-clockwise 90 degrees, such that sensor elements 308a-308d are Bψ, rather than BR, sensor elements. Other features, including the relative arrangement of sensor unit 305 with respect to magnet 102 and shaft 14, are similar to or the same as those of FIG. 10A unless otherwise specified herein.

The magnetic field of magnet 102 of rotational symmetry and with homogeneous magnetization in the y-direction is given by $$B_R(R,\psi,z)=B_{rem} \sin \psi(b_0+b_1)$$

$$B_\psi(R,\psi,z)=B_{rem} \cos \psi(b_0-b_1)$$

$$B_z(R,\varphi,z)=B_{rem} \sin \psi b_2$$

where b0, b1, and b2 are functions of R and ψ only. Referring to FIG. 10A, if the field on sensor element 308a (H_1) is denoted as $B_{R1}$, 308b (H_2) as $B_{R2}$, 308c (H_3) as $B_{R3}$ and 308d (H_4) as $B_{R4}$, the following results:

$$\frac{B_{R1}+B_{R2}-(B_{R3}+B_{R4})}{B_{R1}-B_{R2}-(B_{R3}-B_{R4})}=$$

$$\frac{\sin\psi+\sin(\psi+90°)-(\sin(\psi+180°)+\sin(\psi-90°))}{\sin\psi-\sin(\psi+90°)-(\sin(\psi+180°)-\sin(\psi-90°))}=$$

$$\frac{\sin\psi+\cos\psi}{\sin\psi-\cos\psi}=-\tan(\psi+45°)$$

whereby sensor element 308a (H_1) is located at position ψ and ψ=0 denotes the x-axis. This means that sensor 100 comprising sensor unit 305 can estimate the angular position of magnet 102 by:

$$\psi'=\arctan[B_{R3}+B_{R4}-(B_{R1}+B_{R2}),B_{R1}-B_{R2}-(B_{R3}-B_{R4})]-45°.$$

Conversely, and referring to FIG. 10B, if the field on sensor element 308a (H_1) is denoted as $B_{\psi 1}$, sensor element 308b (H_2) as $B_{\psi 2}$, sensor element 308c (H_3) as $B_{\psi 3}$ and 308d (H_4) as $B_{\psi 4}$, the following results:

$$\frac{B_{\psi 1} + B_{\psi 2} - (B_{\psi 3} + B_{\psi 4})}{B_{\psi 1} - B_{\psi 2} - (B_{\psi 3} - B_{\psi 4})} =$$

$$\frac{\cos\psi + \cos(\psi + 90°) - (\cos(\psi + 180°) + \cos(\psi - 90°))}{\cos\psi - \cos(\psi + 90°) - (\cos(\psi + 180°) - \cos(\psi - 90°))} =$$

$$\frac{\cos\psi - \sin\psi}{\cos\psi + \sin\psi} = \tan(-\psi + 45°)$$

whereby sensor element 308a (H_1) is located at position $\psi$ and $\psi=0$ denotes the x-axis. Thus, sensor 100 comprising sensor unit 305 can estimate the angular position of magnet 102 by:

$$\psi' = \arctan[B_{\psi 3} + B_{\psi 4} - (B_{\psi 1} + B_{\psi 2}), B_{\psi 1} - B_{\psi 2} - (B_{\psi 3} - B_{\psi 4})] - 45°.$$

Finally, if sensor elements 308a-308d are arranged to be responsive instead to the z-component of the magnetic field, such as similarly to as is depicted in FIG. 9, the field on sensor element 308a (H_1) is denoted as $B_{z1}$, sensor element 308b (H_2) as $B_{z2}$, 308c (H_3) as $B_{z3}$ and 308d (H_4) as $B_{z4}$, the following results:

$$\frac{B_{z1} + B_{z2} - (B_{z3} + B_{z4})}{B_{z1} - B_{z2} - (B_{z3} - B_{z4})} =$$

$$\frac{\sin\psi + \sin(\psi + 90°) - (\sin(\psi + 180°) + \sin(\psi - 90°))}{\sin\psi - \sin(\psi + 90°) - (\sin(\psi + 180°) - \sin(\psi - 90°))} =$$

$$\frac{\sin\psi + \cos\psi}{\sin\psi - \cos\psi} = -\tan(\psi + 45°)$$

whereby sensor element 308a (H_1) is located at position $\psi$ and $\psi=0$ denotes the x-axis. Thus, sensor 100 comprising sensor unit 305 can estimate the angular position of magnet 102 by:

$$\psi' = \arctan[B_{z3} + B_{z4} - (B_{z1} + B_{z2}), B_{z1} - B_{z2} - (B_{z3} - B_{z4})] - 45°.$$

In an embodiment, these three systems (BR for radial, B$\psi$ for azimuthal and Bz for axial) can be combined. For example, instead of having a single sensor element 308a (H_1), sensor unit 305 comprises three sensor elements each sensitive to one of a radial, azimuthal, and axial magnetic field component. The same applies to the sensor elements 308b (H_2), 308c (H_3) and 308d (H_4). Then sensor 100 can estimate the rotation angle according to the respective formula given above. Finally, sensor 100 can compare the three angle values and combine them in a way to be more precise in spite of assembly tolerances, background fields (particularly inhomogeneous background fields), and errors associated with the sensor elements (e.g., offset, noise, thermal drift, etc.). In one embodiment, this combination can comprise averaging, though other methods can be used in other embodiments.

Figure 10C:
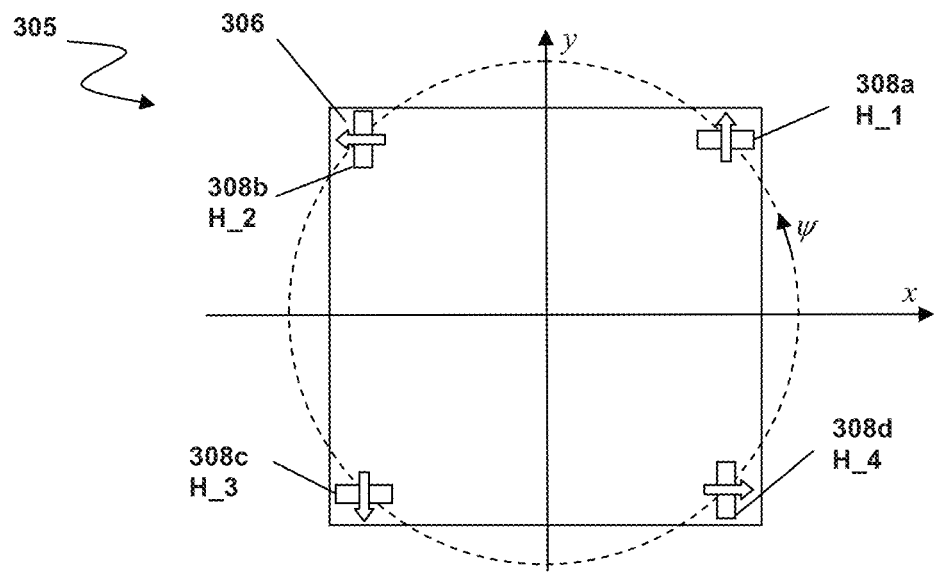
FIG. 10C is a top view block diagram of another vertical Hall sensor unit according to an embodiment.
Figure 10D:
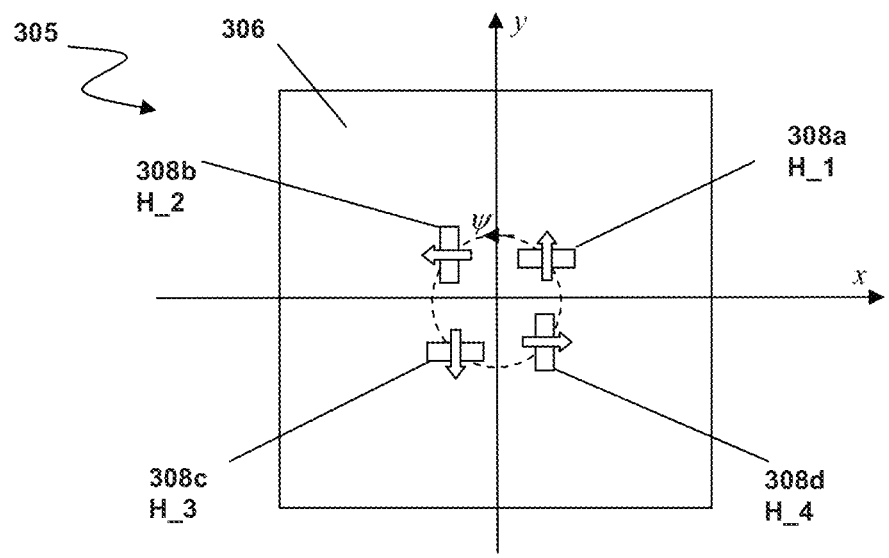
FIG. 10D is a top view block diagram of another vertical Hall sensor unit according to an embodiment.

The configurations of FIGS. 10A and 10B can vary in other embodiments. For example, FIGS. 10C and 10D depict two additional vertical Hall arrangements, though still other arrangements and configurations can be used in other embodiments. The particular examples given herein are merely examples and are not be considered limiting. In FIG. 10C, sensor elements 308a-308d are arranged proximate the corners of substrate 306. In FIG. 10D, sensor elements 308a-308d are instead arranged proximate a center or midpoint of substrate 306, which can be aligned with a rotation axis of shaft 104 in on-axis embodiments, as discussed elsewhere herein.

In general, a sensor system according to embodiments comprises n sensor units located at azimuthal positions of 0 degrees, 360 degrees/n, 2*360°/n, . . . (n−1)*360°/n, relative to a concentric axis of rotation of a magnet. Each sensor unit can provide at least one output signal that encodes a measured angle in a range of 0 degrees to 360 degrees. In the absence of angle errors and for small rotation angles of $\psi_0$<360 degrees/n, a first sensor unit measures $\psi_0$, a second sensor unit measures $\psi_0$+360 degrees/n, a third sensor unit measures $\psi_0$+2*360 degrees/n, and sensor unit n measures $\psi_0$+(n−1)*360 degrees/n, which is still less than 360 degrees.

If the rotation angle increases, the angles measured by all sensor units will not be monotonous: Suppose n=3 and $\psi_0$=150 degrees. The first sensor unit measures 150 degrees, the second sensor unit measures 150+120=270 degrees, the third sensor unit measures mod(150+240, 360)=30 degrees. Thus, the measured angles are 150 degrees, 270 degrees, and 30 degrees. They are not monotonous, because 30 degrees is less than 270 degrees. In such a case, the sensor system needs to precondition the measured angles: It adds integer multiples of 360 degrees to each measured angle until all angles are monotonous, i.e. angle(#1)<angle(#2)<angle(#3)< . . . <angle(#n). After this manipulation, the sensor system subtracts the azimuthal position from each angle. Thus, angle(#1) remains unchanged; from angle(#2) the system subtracts 360 degrees/n, from angle(#3) the system subtracts 2*360 degrees/n, and from angle(#n) the system subtracts (n−1)*360 degrees/n. Finally, all of these values can be averaged and the remainder after division by 360 degrees is taken as the result. Hence, this sequence of operations can be essentially an averaging in embodiments, but it can consider some pre- and post-conditioning to account for the finite interval [0 degrees, 360 degrees] of acceptable angle ranges. Thus, it can be referred to as a conditioned averaging. In embodiments, the subtraction of azimuthal positions can be omitted because it only shifts the zero point of the measured angle.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A magnetic field angle sensor comprising:
a magnet rotatable about an axis of rotation;
a plurality of sensor units arranged proximate the magnet and spaced apart from one another about the axis of rotation by (360 degrees/n), where n is the number of sensor units and is greater than or equal to 2, wherein each of the at least two sensor units comprises two magnetic field sensor elements spaced apart from each other, each responsive to the same magnetic field component induced by the magnet, wherein each of the at least two sensor units comprises a substrate associated with the respective sensor unit in which the two magnetic field sensor elements are provided and a respective package associated with the respective sensor unit; and
circuitry coupled to the plurality of sensor units, wherein the circuitry is configured to receive output signals from each of the two magnetic field sensor elements for the at least two sensor units, and wherein the circuitry is configured to determine, for each of the at least two sensor units, a first coarse estimation of an angle of rotation of the magnet based on: a sum of output signals of the two magnetic field sensor elements of the respective sensor unit, and a difference of output signals of the two magnetic field sensor elements of the respective sensor unit, and
wherein the circuitry is further configured to determine a second refined estimation of the angle of rotation of the magnet from the first coarse estimation of at least two of the sensor units.

2. The magnetic field angle sensor of claim 1, wherein the plurality of sensor units is arranged in the same plane.

3. The magnetic field angle sensor of claim 2, wherein the plane is perpendicular to the axis of rotation.

4. The magnetic field angle sensor of claim 1, wherein the circuitry is configured to retrieve a scaling factor from a memory and utilize the scaling factor in determining the first coarse estimation.

5. The magnetic field angle sensor of claim 4, wherein the scaling factor is based on a dimension characteristic of the magnet.

6. The magnetic field angle sensor of claim 4, wherein the circuitry is configured to employ the scaling factor in the difference of output signals portion of the determination of the first coarse estimation.

7. The magnetic field angle sensor of claim 1, wherein the circuitry is further configured to employ a radial distance between the two magnetic field sensor elements of a respective sensor unit and the axis of rotation in determining the first coarse estimation of the respective sensor unit.

8. The magnetic field angle sensor of claim 7, wherein the radial distance between the two magnetic field sensor elements of a respective sensor unit and the axis of rotation is employed in a denominator of the first coarse estimation determination by the circuitry.

* * * * *